(12) United States Patent
Pernici et al.

(10) Patent No.: US 6,535,724 B1
(45) Date of Patent: Mar. 18, 2003

(54) RECEIVER PORTION OF A TELEPHONE

(75) Inventors: Sergio Pernici, Bergamo (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 325 days.

(21) Appl. No.: 09/619,193

(22) Filed: Jul. 19, 2000

(30) Foreign Application Priority Data

Jul. 20, 2000 (EP) ............................................. 99830462

(51) Int. Cl.[7] ................................................. H04B 1/10
(52) U.S. Cl. ....................... 455/296; 455/130; 455/222; 455/223; 455/126; 330/296; 381/94.5
(58) Field of Search ................................ 455/126, 296, 455/194.1, 221, 222, 223, 226.1, 130, 303, 226.2, 212; 330/278, 279, 296, 297, 51; 381/94.5, 120, 94.1

(56) References Cited

U.S. PATENT DOCUMENTS

| | | | | |
|---|---|---|---|---|
| 3,916,321 A | * | 10/1975 | Morse ......................... | 455/222 |
| 5,150,075 A | * | 9/1992 | Hietala et al. .............. | 330/279 |
| 5,151,942 A | * | 9/1992 | Sasaki ........................ | 381/94.5 |
| 5,249,233 A | * | 9/1993 | Kennedy et al. ............ | 381/13 |
| 5,255,094 A | * | 10/1993 | Yong et al. ................. | 348/632 |
| 5,278,994 A | * | 1/1994 | Black et al. ................ | 455/126 |
| 5,444,312 A | | 8/1995 | Noblett et al. .............. | 327/552 |
| 5,796,851 A | * | 8/1998 | Hewitt et al. .............. | 381/94.5 |

FOREIGN PATENT DOCUMENTS

| | | | |
|---|---|---|---|
| EP | 0 570 655 | 11/1993 | ............ H03G/3/34 |
| GB | 2 279 192 | 12/1994 | ............ H03F/1/00 |

* cited by examiner

Primary Examiner—Nay Maung
Assistant Examiner—Sonny Trinh
(74) Attorney, Agent, or Firm—Allen, Dyer, Doppelt, Milbrath & Gilchrist, P.A.; Lisa K. Jorgenson

(57) ABSTRACT

A receiver portion of a telephone includes a differential amplifier stage with a single output, an electroacoustic transducer connected between the output, via a capacitor and ground and a unit for controlling switching on/off, connected to the differential stage for the activation or deactivation thereof. To prevent annoying noises in the transducer upon switching on and off, the differential stage includes an operational amplifier having a first capacitor and a second capacitor in series with the inverting and the non-inverting input terminals. A third capacitor is connected between the inverting input and the output of the operational amplifier. A fourth capacitor is connected between the non-inverting input and a first reference-voltage terminal. A first switching capacitor is alternatively connectable between a second and a third reference-voltage terminal, or between the first input and the output of the operational amplifier. A second switching capacitor is alternatively connectable between a fourth and a fifth reference-voltage terminal, or between the second input of the operational amplifier and the fifth reference-voltage terminal.

36 Claims, 2 Drawing Sheets

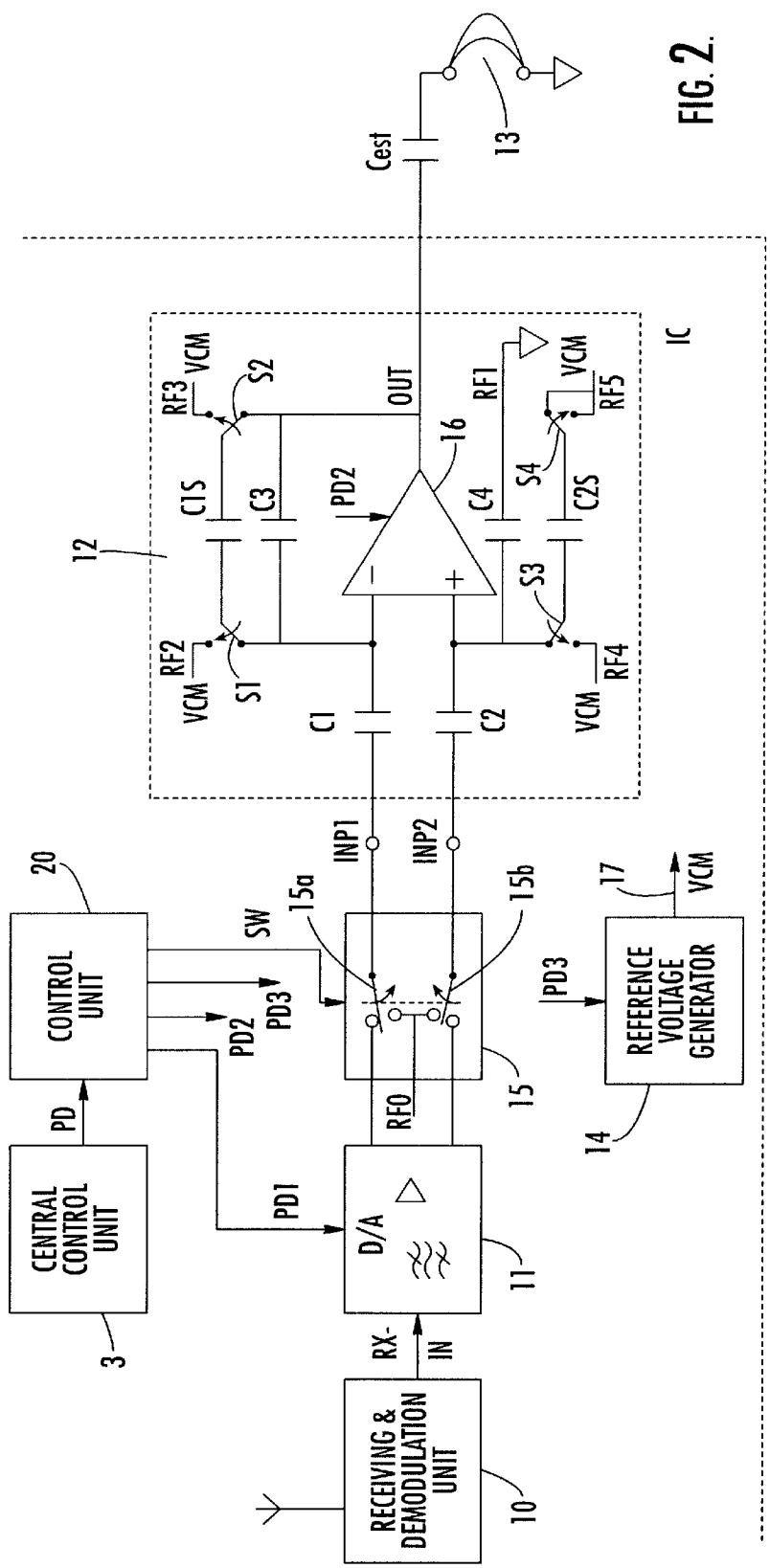

RECEIVER PORTION OF A TELEPHONE

FIELD OF THE INVENTION

The present invention relates to communication equipment, and, more particularly, to a receiver portion of a telephone.

BACKGROUND OF THE INVENTION

The signal received by a telephone of a digital telephone network is processed in digital form, converted into analog form, and finally amplified and applied to an electroacoustic transducer. The receiver portion of a mobile phone can be represented schematically as shown in FIG. 1. A demodulated digital signal RX-IN produced by a receiving and demodulation unit 10 is applied to the input of a circuit unit 11 which converts the signal into analog form, and which filters and amplifies the signal. The analog signal output from the unit 11 is applied to the input of a power amplifier stage which can transfer the signal to an electroacoustic transducer 13, such as an electromagnetic unit or loud speaker, with sufficient electrical power for the operation thereof.

The power amplifier stage comprises an operational amplifier 16 and has a gain determined by the ratio between the resistance of a feedback resistor R2 disposed between the output and the inverting input of the operational amplifier 16 and the resistance of a resistor R1 disposed between the output of the unit 11 and the inverting input of the operational amplifier. To prevent power dissipation when the telephone is not in use, a circuit which responds to an external activation or deactivation control is provided both in the unit 11 and in the amplifier 16. This function is represented by the connection of the unit 11 and of the amplifier 16 to a terminal to which a single-bit digital signal PD (power down) can be applied. By convention, the receiving circuit unit is put in the zero current-consumption state when PD=1, and is enabled to consume current from the supply (power up) when PD=0.

As is known, each time there is a change from the "power down" state to the "power up" state or vice versa, both the signal-processing unit and the power amplifier are subject to an abrupt voltage and current transient before reaching the steady operating state. During this transient, electrical interference with frequency components in the acoustic band are produced and are translated into audible and annoying noises in the electroacoustic transducer.

In an attempt to address these problems, various measures which provide for the connection of active and passive components in series and/or in parallel with the transducer have been adopted to filter out the undesired electrical interference. However, approaches of this type require fairly bulky components outside the power amplifier, which is normally in the form of an integrated circuit.

It has also been proposed to use processing units and amplification units with balanced inputs and outputs to render the electroacoustic transducer insensitive to at least some of the possible interference, particularly so-called common-mode interference. Naturally, however, the use of a balanced amplification unit is possible only when the electroacoustic transducer can be connected between the two balanced outputs of the amplification unit. When this is not possible because one of the terminals of the transducer has to be connected to a fixed power terminal, for example, to the ground of the circuit, the only suitable prior art approach is to use the above-mentioned external filters.

SUMMARY OF THE INVENTION

In view of the foregoing background, it is therefore an object of the present invention to provide a receiver portion free of the above-described interference in which the electroacoustic transducer has a terminal connected to the ground terminal, but which does not require filtering components.

This object is achieved by the provision of the receiver portion comprising a differential amplifier stage having differential inputs and having an output, and an electroacoustic transducer connected between the output of the differential amplifier stage and a supply voltage reference. The differential amplifier stage may comprise an operational amplifier having an output defining the output of the differential amplifier stage and having first and second inputs, first and second capacitors connected between respective first and second inputs of the operational amplifier and the differential inputs of the differential amplifier stage, a third capacitor connected between the first input and the output of the operational amplifier, and a fourth capacitor connected between the second input of the operational amplifier and a first reference voltage. In addition, the differential amplifier stage may include a fifth capacitor, and at least one first switch for alternatively connecting the fifth capacitor between a second reference voltage and a third reference voltage, or between the first input and the output of the operational amplifier. The differential amplifier stage may also include a sixth capacitor, and at least one second switch for alternatively connecting the sixth capacitor between a fourth reference voltage and a fifth reference voltage, or between the second input of the operational amplifier and the fifth reference voltage.

The receiver may also include a switching unit for interrupting a connection to the differential inputs of the differential amplifier stage responsive to a control signal. In one embodiment, the switching unit may include at least one third switch responsive to the control unit for connecting the differential inputs to one another at a common terminal for a predetermined time based upon activation of the differential amplifier stage. In another embodiment, the switching unit comprises at least one third switch responsive to the control unit for interrupting a connection between the differential inputs of the differential amplifier stage and respective ones of the first and second capacitors, and for connecting the first and second capacitors to one another at a common terminal for a predetermined time based upon activation of the differential amplifier stage.

BRIEF DESCRIPTION OF THE DRAWINGS

The invention will be understood further from the following detailed description of a non-limiting embodiment thereof, given with reference to the appended drawings, in which:

FIG. 2 is a diagram, partially in block form, showing an embodiment of the invention;

FIG. 4 is a diagram showing a variant of the diagram of FIG. 2.

DETAILED DESCRIPTION OF THE PREFERRED EMBODIMENTS

Figure 1:
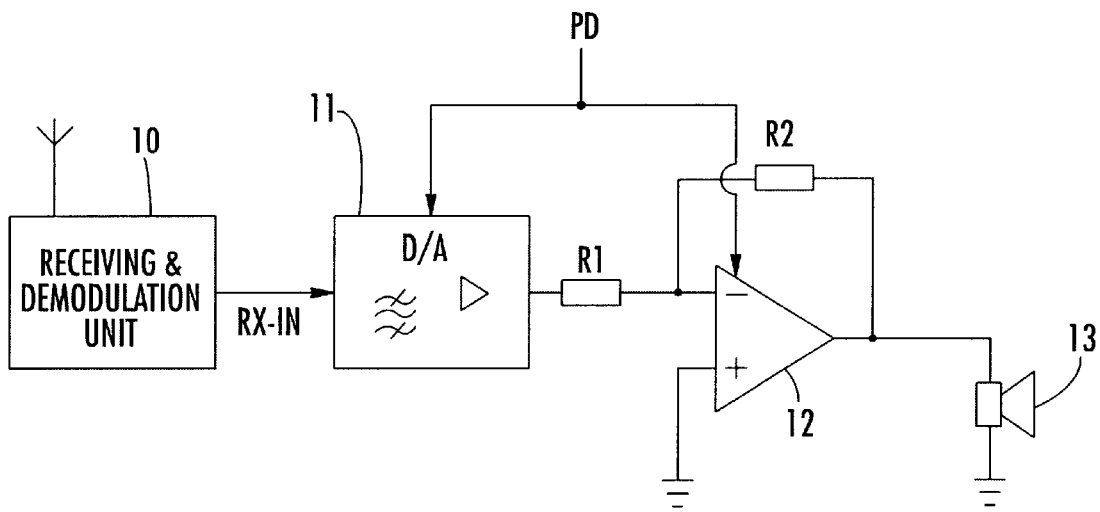
FIG. 1 is a block diagram of a generic receiver portion of a telephone according to the prior art.

Referring now to FIG. 2, elements identical or corresponding to those of FIG. 1 are indicated by the same reference numerals. FIG. 2 is a diagram, partially in block form and partially in circuit form, of a receiver portion according to the invention formed mainly in an integrated circuit. A processing unit 11 receives as an input a demodulated digital signal RX-IN, generated by a receiving and demodulation unit 10, and supplies a balanced analog signal at two outputs. The outputs of the unit 11 are connected to the differential inputs INP1 and INP2 of a differential amplifier stage 12 via a switching unit 15. The latter comprises two switches 15a and 15b which may preferably be formed by MOSFET transistors and which can adopt a first position in which they establish a connection between the outputs of the unit 11 and the input terminals of the differential amplifier stage 12, or a second position in which they interrupt this connection and connect the differential inputs INP1 and INP2 of the stage 12 to one another at a common terminal RFO. The switches 15a and 15b are controlled by a control unit 20, as will be explained below.

The control unit 20 receives as an input a binary signal PD (power down) from a central control unit 3 of the telephone circuits. It responds to this signal producing, in accordance with a predetermined timing sequence, activation/deactivation signals PD1, PD2 and PD3 which are applied to the processing unit 11, to the differential amplifier stage 12, and to a reference-voltage generator 14, respectively.

Figure 3:
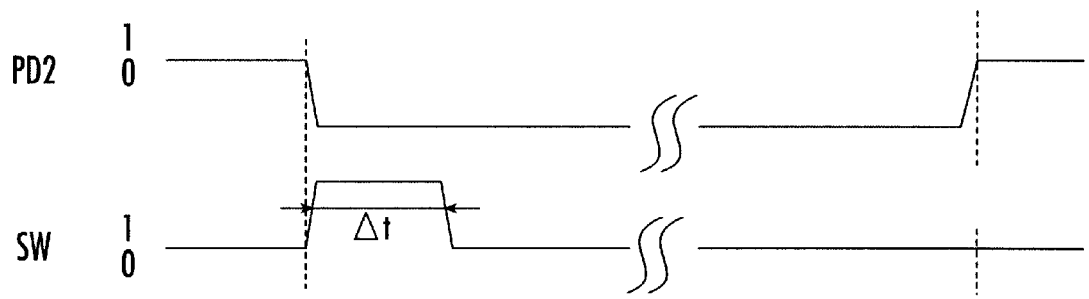
FIG. 3 is a graph showing the time relationship between two control signals of the circuit of FIG. 2.

The control unit 20 also generates a switching signal (SW) which is applied to the switching unit 15. In this embodiment of the invention, the timing sequence relating to the signals PD2 and SW is shown in FIG. 3. The activation of the differential amplifier stage 12 and the switching of the unit 15 to the position in which the differential inputs are short-circuited are simultaneous.

The differential amplifier stage 12 has a single output terminal OUT which is connected, via a decoupling capacitor Cest, outside the integrated circuit, to an electroacoustic transducer 13 which has a second terminal connected to the ground terminal of the integrated circuit. The stage 12 comprises an operational amplifier 16 having its output connected to the output terminal OUT, its inverting input connected to one (INP1) of the differential inputs via a first capacitor C1, and its non-inverting input connected to the other (INP2) of the differential inputs via a second capacitor C2. A third capacitor C3 is connected between the inverting input and the output OUT of the operational amplifier 16 and a fourth capacitor C4 is connected between the non-inverting input and a first reference-voltage terminal RF1. In this embodiment of the invention, the reference terminal RF1 is connected to the ground terminal of the circuit, but it could also be connected to a terminal having a potential other than the ground potential.

The stage 12 also comprises two switching capacitors of which one, indicated C1S, is connected alternatively between two reference-voltage terminals RF2 and RF3, or between the inverting input and the output of the operational amplifier 16 by way of two switches S1 and S2, preferably formed by MOSFET transistors. The other switching capacitor, indicated C2S, is connected alternatively between a further two reference-voltage terminals RF4 and RF5 or between the non-inverting input and the reference-voltage terminal RF5, by way of two switches S3 and S4 which are also preferably MOSFET transistors.

In this embodiment, all of the terminals RF2–RF5 are connected to the output terminal 17 of the reference-voltage generator 14 at which a constant voltage VCM is established when the generator is activated. This constant voltage VCM is preferably equal to half of the maximum amplitude of the respective output signal relative to the ground potential.

In general, however, the reference voltages may differ from one another. For example the voltages at RF2 and RF4 could be equal to one another and less than the voltages at RF3 and RF5, to facilitate the design of the input stage of the operational amplifier 16. The switches S1–S4 associated with the switching capacitors C1S, C2S are controlled, preferably in synchronism, by a clock-signal generator, not shown.

The operation of the circuit will now be considered, starting from a situation in which the processing unit 11, the differential amplifier stage 12, and the reference-voltage generator 14 are connected to a voltage supply, not shown, but are deactivated. As soon as the central unit 3 generates a signal PD=0, that is, an activation (power up) signal, the control unit 20 generates activation signals PD1, PD2 and PD3 which activate the processing unit 11, the amplifier stage 12, and the reference-voltage generator 14 in accordance with a predetermined timing sequence. The activation of the three circuits is preferably not simultaneous. For example, it may be appropriate for the generator 14 to be activated before the activation of the amplifier stage 12 to supply a reference voltage to other units of the integrated circuit. The control unit 20 also generates a signal SW which is simultaneous with the signal PD2 for activating the amplifier stage 12 but of a limited duration, indicated Δt in FIG. 3, and which brings the switches 15a and 15b to the position defined as the first position. In the first position the differential input terminals INP1 and INP2 are joined together and to the common terminal RF0 and disconnected from the output terminals of the processing unit 11. In this embodiment, a reference voltage equal to the common-mode voltage of the output of the processing unit 11 is preferably applied to the common terminal RF0.

For the circuit to operate correctly, the switching capacitors C1S and C2S have capacitances much lower than those of the capacitors C3 and C4. In a practical application, these capacitances were as follows: C1=C2=C3=C4=10 pF (stage 12 has a gain =1), and CS1=CS2=0.05 pF.

First of all, the effect of the switching of the capacitor C1S will be considered. During one stage of the clock signal, C1S has both its electrodes or terminals at the same voltage VCM, and is thus discharged. During the next stage of the clock signal, C1S is connected in parallel with C3 so that this capacitor also tends to be discharged because any charge therein tends to be transferred to the capacitor C1S, charging it. During the next stage C1S is discharged again and so on until C3 is discharged. The effect of the switching capacitor C1S is equivalent to that of a resistor with a high resistance in parallel with the capacitor C3, that is, of a feedback resistor between the output and the inverting input of the operational amplifier 16.

The effect of the switching of the capacitor C2S will now be considered. During one stage of the clock signal, C2S also has both of its electrodes at the same voltage VCM, so that it is discharged. During the next stage of the clock signal, C2S has one electrode at the voltage VCM and the other electrode connected to the capacitor C4, so that the latter receives a charge from C2S. After a certain number of cycles of the clock signal, the capacitor C4 will be charged to the voltage VCM. The effect of the switching capacitor C2S is equivalent to that of a resistor with a high resistance between the non-inverting input of the amplifier 16 and the reference terminal RF4 at the voltage VCM.

Since the operational amplifier 16 has a very high gain in open loop, the voltage between its inputs in closed loop is so small that the potentials of its two inputs may be considered equal (virtual ground). After a certain number of clock-signal cycles, the voltage at the output terminal OUT will be equal to the sum of the voltages at C3 and C4, that is VOUT=0+VCM=VCM. With this circuit configuration, the output of the amplifier 12 is thus brought to the reference voltage (VCM) within a period of time which can be selected so as to be sufficiently long to avoid transitions which might give rise to audible noise in the electroacoustic transducer. This rise time is determined by the ratio between the capacitances of the capacitors C2S and C4 and by the frequency of the clock signal controlling the switching of C2S. The time constant which determines the rise is $\tau=C4/(fs \cdot C2S)$, in which fs indicates the clock-signal frequency and C4 and C2S indicate the capacitances of the capacitors indicated by the same symbols. For example, if fs=16 kHz, C4=10 pF and C2S=0.05 pF then $\tau$=12.5 ms. The rise of the output voltage of the amplifier to VCM is exponential with a time constant $\tau$. The transitional state of the amplifier upon switching on is considered completed after a time $\Delta t$=4 to 5$\tau$ (50–60 ms) from the start of the activation of the amplifier, that is, from the switching from PD2=1 to PD2=0. When this time has elapsed, the control unit 20 causes the signal SW to switch, bringing the switches 15a and 15b of the unit 15 to the second position, that is, the position in which the outputs of the processing unit 11 are connected to the inputs of the differential stage 12.

In these conditions, the analog signal coming from the processing unit 11 is applied to the differential inputs INP1 and INP2 of the amplifier stage 12. The latter behaves, for the audio-frequency signal applied between its inputs, as a normal amplifier with feedback in which, instead of resistors, there are capacitive impedances.

According to the variant shown in FIG. 4, the switching unit 15 is disposed between the capacitors C1 and C2 and the inputs of the operational amplifier 16. In this case, the voltage VCM is preferably applied to the terminal RF0' which is common to the two electrodes of the capacitors C1 and C2 in one of the two positions of the switches 15a and 15b.

As can be seen, the receiver portion according to the invention operates with the same immunity to interference as a fully balanced structure, even though the transducer is not connected between two balanced outputs. Moreover, it is easy to produce, takes up a very limited area since it uses capacitors instead of resistors, and does not require bulky external components but only a few additional components which can easily be integrated.

That which is claimed is:

1. A receiver portion of a telephone comprising:
   a signal receiving and demodulating unit;
   a processing unit for processing a demodulated signal from said signal receiving and demodulating unit, said processing unit having two outputs;
   a differential amplifier stage having differential inputs connected to the two outputs of said processing unit, and having an output;
   an electroacoustic transducer capacitively coupled between the output of the differential amplifier stage and a supply voltage reference;
   a control unit connected to said differential amplifier stage for controlling at least one of activation and deactivation thereof;
   said differential amplifier stage comprising
      an operational amplifier having an output defining the output of said differential amplifier stage and having first and second inputs,
      first and second capacitors connected between respective first and second inputs of said operational amplifier and the differential inputs of said differential amplifier stage,
      a third capacitor connected between the first input and the output of said operational amplifier,
      a fourth capacitor connected between the second input of said operational amplifier and a first reference voltage,
      a fifth capacitor,
      at least one first switch for alternatively connecting said fifth capacitor between a second reference voltage and a third reference voltage, or between the first input and the output of said operational amplifier,
      a sixth capacitor, and
      at least one second switch for alternatively connecting said sixth capacitor between a fourth reference voltage and a fifth reference voltage, or between the second input of said operational amplifier and the fifth reference voltage; and
   a switching unit connected between said processing unit and said differential amplifier stage and comprising at least one third switch responsive to said control unit for interrupting a connection between the differential inputs of said differential amplifier stage and the two outputs of said processing unit and for connecting the differential inputs to one another at a common terminal for a predetermined time based upon activation of said differential amplifier stage.

2. A receiver portion according to claim 1 wherein the common terminal is at a sixth reference voltage.

3. A receiver portion according to claim 1 wherein the common terminal is at a common mode voltage of the output of said processing unit.

4. A receiver portion according to claim 1 wherein the first reference voltage is at ground.

5. A receiver portion according to claim 1 wherein the second reference voltage and the fourth reference voltage are at a first voltage; and wherein the third reference voltage and the fifth reference voltage are at a second voltage.

6. A receiver portion according to claim 1 wherein the second, third, fourth and fifth reference voltages are at a same voltage.

7. A receiver portion according to claim 1 wherein said at least one first switch and said at least one second switch operate at a predetermined frequency.

8. A receiver portion according to claim 1 wherein connecting the differential inputs to one another at the common terminal for the predetermined time starts upon activation of said differential amplifier stage.

9. A receiver portion of a telephone comprising:
   a signal receiving and demodulating unit;
   a processing unit for processing a demodulated signal from said signal receiving and demodulating unit, said processing unit having two outputs;
   a differential amplifier stage having differential inputs connected to the two outputs of said processing unit, and having an output;
   an electroacoustic transducer capacitively coupled between the output of said differential amplifier stage and a supply voltage reference;
   a control unit connected to the differential amplifier stage for controlling at least one of activation and deactivation thereof;
   said differential amplifier stage comprising
      an operational amplifier having an output defining the output of said differential amplifier stage and having first and second inputs, first and second capacitors connected between respective first and second inputs of said operational amplifier and the differential inputs of said differential amplifier stage, a third capacitor connected between the first input and the output of said operational amplifier, a fourth capacitor connected between the second input of said operational amplifier and a first reference voltage, a fifth capacitor, at least one first switch for alternatively connecting said fifth capacitor between a second reference voltage and a third reference voltage, or between the first input and the output of said operational amplifier, a sixth capacitor, and at least one second switch for alternatively connecting said sixth capacitor between a fourth reference voltage and a fifth reference voltage, or between the second input of said operational amplifier and the fifth reference voltage; and a switching unit connected between said processing unit and said differential amplifier stage and comprising at least one third switch responsive to said control unit for interrupting a connection between the differential inputs of said differential amplifier stage and respective ones of said first and second capacitors, and for connecting the first and second capacitors to one another at a common terminal for a predetermined time based upon activation of said differential amplifier stage.

10. A receiver portion according to claim 9 wherein the common terminal is at a sixth reference voltage.

11. A receiver portion according to claim 9 wherein the common terminal is at a common mode voltage of the output of said processing unit.

12. A receiver portion according to claim 9 wherein the first reference voltage is at ground.

13. A receiver portion according to claim 9 wherein the second reference voltage and the fourth reference voltage are at a first voltage; and wherein the third reference voltage and the fifth reference voltage are at a second voltage.

14. A receiver portion according to claim 9 wherein the second, third, fourth and fifth reference voltages are at a same voltage.

15. A receiver portion according to claim 9 wherein said at least one first switch and said at least one second switch operate at a predetermined frequency.

16. A receiver portion according to claim 9 wherein connecting the differential inputs to one another at the common terminal for the predetermined time starts upon activation of said differential amplifier stage.

17. A telephone comprising:

a differential amplifier stage having differential inputs and having an output;

an electroacoustic transducer connected between the output of said differential amplifier stage and a supply voltage reference;

said differential amplifier stage comprising an operational amplifier having an output defining the output of said differential amplifier stage and having first and second inputs, first and second capacitors connected between respective first and second inputs of said operational amplifier and the differential inputs of said differential amplifier stage, a third capacitor connected between the first input and the output of said operational amplifier, a fourth capacitor connected between the second input of said operational amplifier and a first reference voltage, a fifth capacitor, at least one first switch for alternatively connecting said fifth capacitor between a second reference voltage and a third reference voltage, or between the first input and the output of said operational amplifier, a sixth capacitor, and at least one second switch for alternatively connecting said sixth capacitor between a fourth reference voltage and a fifth reference voltage, or between the second input of said operational amplifier and the fifth reference voltage; and a switching unit for interrupting a connection to the differential inputs of said differential amplifier stage responsive to a control signal.

18. A telephone according to claim 17 wherein said switching unit comprises at least one third switch responsive to the control signal for connecting the differential inputs to one another at a common terminal for a predetermined time based upon activation of said differential amplifier stage.

19. A telephone according to claim 18 wherein the common terminal is at a sixth reference voltage.

20. A telephone according to claim 17 wherein said switching unit comprises at least one third switch responsive to the control signal for interrupting a connection between the differential inputs of said differential amplifier stage and respective ones of said first and second capacitors, and for connecting the first and second capacitors to one another at a common terminal for a predetermined time based upon activation of said differential amplifier stage.

21. A telephone according to claim 20 wherein the common terminal is at a sixth reference voltage.

22. A telephone according to claim 17 wherein the first reference voltage is at ground.

23. A telephone according to claim 17 wherein the second reference voltage and the fourth reference voltage are at a first voltage; and wherein the third reference voltage and the fifth reference voltage are at a second voltage.

24. A telephone according to claim 17 wherein the second, third, fourth and fifth reference voltages are at a same voltage.

25. A telephone according to claim 17 wherein said at least one first switch and said at least one second switch operate at a predetermined frequency.

26. A telephone according to claim 17 wherein said electroacoustic transducer is capacitively coupled to the output of said differential amplifier stage.

27. A method for operating a telephone comprising a differential amplifier stage having differential inputs and having an output; an electroacoustic transducer connected between the output of said differential amplifier stage and a supply voltage reference; and said differential amplifier stage comprising an operational amplifier having an output defining the output of said differential amplifier stage and having first and second inputs, first and second capacitors connected between respective first and second inputs of said operational amplifier and the differential inputs of said differential amplifier stage, a third capacitor connected between the first input and the output of said operational amplifier, and a fourth capacitor connected between the second input of said operational amplifier and a first reference voltage, the method comprising:

alternatively connecting a fifth capacitor between a second reference voltage and a third reference voltage, or between the first input and the output of said operational amplifier;

alternatively connecting a sixth capacitor between a fourth reference voltage and a fifth reference voltage, or between the second input of said operational amplifier and the fifth reference voltage; and interrupting a connection to the differential inputs of said differential amplifier stage responsive to a control signal.

28. A method according to claim 27 further comprising connecting the differential inputs to one another at a common terminal for a predetermined time based upon activation of said differential amplifier stage.

29. A method according to claim 28 wherein the common terminal is at a sixth reference voltage.

30. A method according to claim 27 wherein interrupting comprises interrupting a connection between the differential inputs of said differential amplifier stage and respective ones of said first and second capacitors, and further comprising connecting the first and second capacitors to one another at a common terminal for a predetermined time based upon activation of said differential amplifier stage.

31. A method according to claim 30 wherein the common terminal is at a sixth reference voltage.

32. A method according to claim 27 wherein the first reference voltage is at ground.

33. A method according to claim 27 wherein the second reference voltage and the fourth reference voltage are at a first voltage; and wherein the third reference voltage and the fifth reference voltage are at a second voltage.

34. A method according to claim 27 wherein the second, third, fourth and fifth reference voltages are at a same voltage.

35. A method according to claim 27 wherein said at least one first switch and said at least one second switch operate at a predetermined frequency.

36. A method according to claim 27 wherein said electroacoustic transducer is capacitively coupled to the output of said differential amplifier stage.

* * * * *

UNITED STATES PATENT AND TRADEMARK OFFICE
CERTIFICATE OF CORRECTION

PATENT NO.    : 6,535,724 B1
DATED         : March 18, 2003
INVENTOR(S)   : Sergio Pernici and Germano Nicollini It is certified that error appears in the above-identified patent and that said Letters Patent is hereby corrected as shown below:

<u>Title page,</u>
Item [30], delete "July 20, 2000" insert -- July 20, 1999 --

Signed and Sealed this

Twenty-sixth Day of August, 2003

JAMES E. ROGAN
*Director of the United States Patent and Trademark Office*